United States Patent
Ooi et al.

(10) Patent No.: US 11,106,059 B2
(45) Date of Patent: Aug. 31, 2021

(54) COLOR-TUNABLE TRANSMISSION MODE ACTIVE PHOSPHOR BASED ON III-NITRIDE NANOWIRE GROWN ON TRANSPARENT SUBSTRATE

(71) Applicant: King Abdullah University of Science and Technology, Thuwal (SA)

(72) Inventors: Boon S. Ooi, Thuwal (SA); Aditya Prabaswara, Thuwal (SA); Bilal Janjua, Thuwal (SA); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 17/111,639

(22) Filed: Dec. 4, 2020

(65) Prior Publication Data
US 2021/0116725 A1    Apr. 22, 2021

Related U.S. Application Data

(63) Continuation of application No. 16/471,789, filed as application No. PCT/IB2017/058476 on Dec. 28, 2017, now Pat. No. 10,884,268.

(Continued)

(51) Int. Cl.
*F21K 9/64*    (2016.01)
*G02F 1/017*    (2006.01)
(Continued)

(52) U.S. Cl.
CPC ............... *G02F 1/017* (2013.01); *F21K 9/62* (2016.08); *F21K 9/64* (2016.08); *F21K 9/68* (2016.08);
(Continued)

(58) Field of Classification Search
CPC ........................................................ F21K 9/64
(Continued)

(56) References Cited

U.S. PATENT DOCUMENTS 6,160,596 A    12/2000    Sylvester et al.
7,714,351 B2   5/2010     Moon et al.
(Continued)

FOREIGN PATENT DOCUMENTS

EP    1875781 A2    1/2008
WO    2017157844 A1    9/2017

OTHER PUBLICATIONS

Dursun, et al., "Perovskite Nanocrystals as a Color Converter for Visible Light Communication", ACS Photonics, 2016, 7 pages.
(Continued)

*Primary Examiner* — Christopher M Raabe
(74) *Attorney, Agent, or Firm* — Billion & Armitage

(57) ABSTRACT

A system and method providing correlated color temperature-tunable (CCT-tunable) white light using a laser diode(s) in conjunction with a III-Nitride nanowires-based LED element grown on a semi-transparent substrate. The tunability spans across yellow, amber, and red wavelengths and can be implemented by current injection. The current-dependent broad wavelength tunability enables control of wide range of CCT values (intensity, peak wavelength, and spectral coverage). The broad coverage in the yellow-amber-red color regime mimics that of a passive yellow phosphor, while the injection of current into the LED element defines an active phosphor element. The semi-transparent active phosphor element allows direct transmission of light from a laser diode(s) for achieving extreme wide tunability of CCT.

20 Claims, 4 Drawing Sheets

Related U.S. Application Data

(60) Provisional application No. 62/439,947, filed on Dec. 29, 2016.

(51) Int. Cl.
| | | |
|---|---|---|
| *F21K 9/62* | (2016.01) | |
| *F21K 9/68* | (2016.01) | |
| *F21K 9/69* | (2016.01) | |
| *H01L 27/15* | (2006.01) | |
| *H01L 33/24* | (2010.01) | |
| *H01L 33/36* | (2010.01) | |
| *F21Y 115/30* | (2016.01) | |
| *F21Y 113/13* | (2016.01) | |
| *H01L 33/06* | (2010.01) | |
| *H01L 33/32* | (2010.01) | |

(52) U.S. Cl.
CPC .............. *F21K 9/69* (2016.08); *H01L 27/153* (2013.01); *H01L 33/24* (2013.01); *H01L 33/36* (2013.01); *F21Y 2113/13* (2016.08); *F21Y 2115/30* (2016.08); *G02F 2202/108* (2013.01); *H01L 33/06* (2013.01); *H01L 33/32* (2013.01)

(58) Field of Classification Search
USPC ........................................................ 362/84
See application file for complete search history.

(56) References Cited

U.S. PATENT DOCUMENTS

| | | | |
|---|---|---|---|
| 8,629,425 B2 | 1/2014 | Soh et al. | |
| 8,647,531 B2 | 2/2014 | Yeh et al. | |
| 8,716,731 B2 | 5/2014 | Yeh et al. | |
| 9,557,016 B2 * | 1/2017 | Van Bommel | F21V 13/08 |
| 2005/0199892 A1 | 9/2005 | Cho et al. | |
| 2005/0206312 A1 | 9/2005 | Cho | |
| 2008/0191608 A1 | 8/2008 | Schmidt | |
| 2009/0153582 A1 | 6/2009 | Hajjar et al. | |
| 2009/0267088 A1 | 10/2009 | Peng et al. | |
| 2010/0327258 A1 | 12/2010 | Lee et al. | |
| 2012/0162979 A1 | 6/2012 | Ng et al. | |
| 2014/0126200 A1 | 5/2014 | Kelchner et al. | |
| 2014/0145225 A1 | 5/2014 | Wu et al. | |
| 2016/0084476 A1 * | 3/2016 | Koole | B05D 1/18 362/84 |
| 2016/0109099 A1 * | 4/2016 | Okuno | H01L 51/5268 362/551 |
| 2018/0187839 A1 | 7/2018 | Vampola | |
| 2019/0165037 A1 | 5/2019 | Chae et al. | |

OTHER PUBLICATIONS

Grubor, et al., "Wireless High-Speed Data Transmission with Phosphorescent White-Light LEDs", 33rd European Conference and Exhibition on Optical Communication, vol. 6, 2007, 2 pages.

Lu, et al., "Phosphor-Free Monolithic White-Light LED", IEEE Journal of Selected Topics in Quantum Electronics, vol. 15, No. 4, Jul./Aug. 2009, pp. 1210-1217.

Narendran, et al., "Solid-State Lighting: Failure Analysis of White LEDs", Journal of Crystal Growth, vol. 268, Aug. 2004, pp. 449-456.

Search Report and Written Opinion for PCT/IB2017/058476 dated Mar. 2, 2018.

Pimputkar, et al., "Prospects for LED Lighting", Natural Photonics, vol. 3, Apr. 2009, pp. 180-182.

* cited by examiner

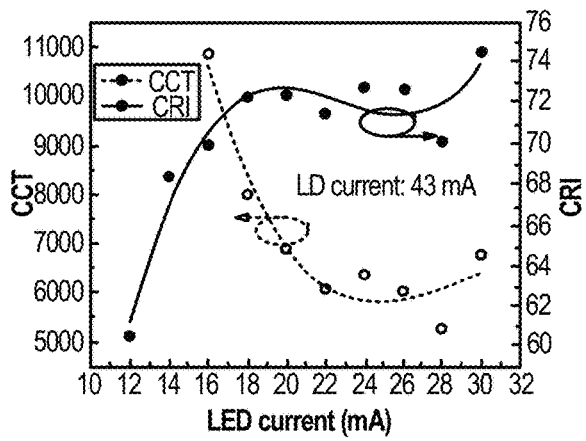 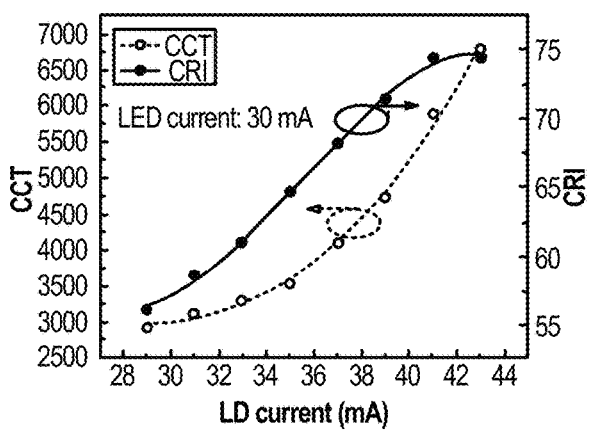
FIG. 4A  FIG. 4B
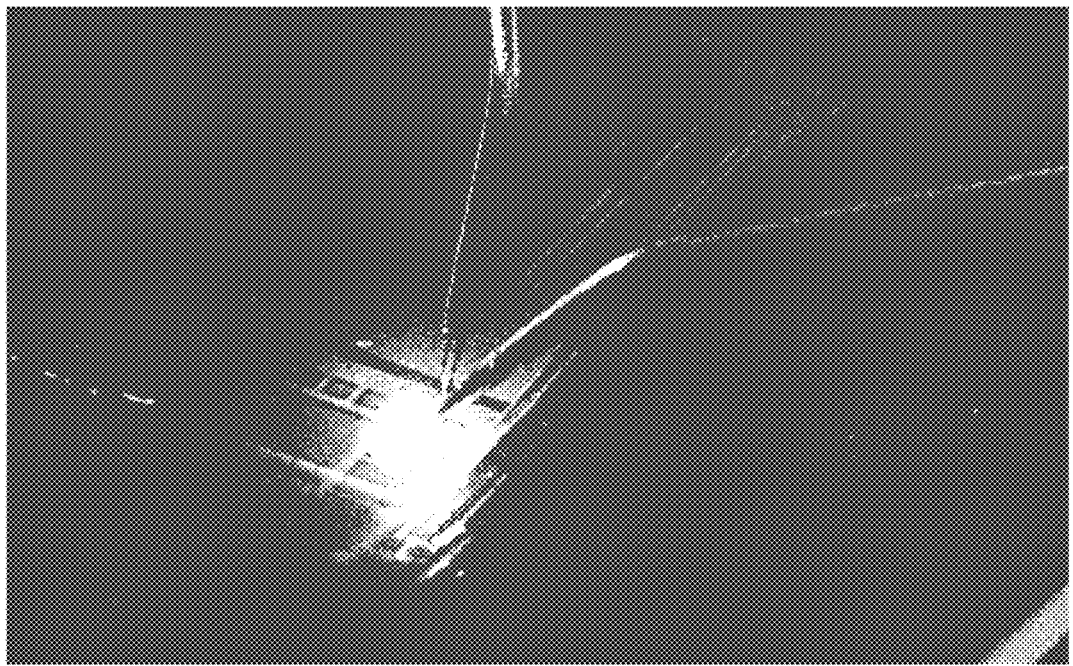
FIG. 5

COLOR-TUNABLE TRANSMISSION MODE ACTIVE PHOSPHOR BASED ON III-NITRIDE NANOWIRE GROWN ON TRANSPARENT SUBSTRATE

BACKGROUND

Light emitting diode (LED) based solid state lighting has gained tremendous popularity due to its advantages over traditional lighting technologies. For white light generation, multiple wavelengths are required to generate a broad spectrum of light which better approximates the black body curve. The conventional approach to white light generation relies on down-converting blue light using YAG:$Ce^{3+}$ phosphor to generate broadband yellow light. By mixing both the blue and yellow component, white light has been produced with high theoretical efficacy.

Unfortunately, white light generation using yellow phosphor poses several limitations, such as quality reduction due to phosphor material degradation and the inability to optimize the intensity and color rendering index. Furthermore, future demand for high speed optical wireless communication is limited by the long carrier relaxation time of the YAG phosphor. Therefore, an alternative method for white light generation capable of providing durable high quality lighting over extended periods of time and with color tunability has become an attractive goal.

Visible lighting and image projection based on solid state devices have recently attracted considerable attention because of their small foot-print, long lifetime, stable light-output, low power consumption and heat generation, and mercury-free manufacture. To achieve white light, most conventional techniques utilize blue LED to excite yellow phosphor or combining red, green and blue (RGB) LEDs to produce white light. As described above, phosphor based techniques suffer from limited controllability of the yellow phosphor component in producing the desired white light characteristics.

SUMMARY

Embodiments of the present disclosure describe a correlated color temperature tunable (CCT-tunable) white light generation system comprising a laser diode or a combination of laser diodes in conjunction with a broadly tunable III-Nitride nanowires-based LED element epitaxially grown on semi-transparent substrate. In one example, a yellow-amber-red III-Nitride nanowires-based LED grown on a transparent quartz substrate is used as the active phosphor and light from a blue laser diode is used as an external light source which is then introduced through the transparent substrate for light mixing. In one embodiment, the external blue light is directed to a substrate underside and passes through the transparent substrate. By mixing light from the active phosphor with an external, secondary light passing through the substrate, it is possible to generate an extremely-wide tunable white light with a varying CCT from cool white (13782 K) to warm white (2812 K) with a color rendering index (CRI) value as high as 74.5. In another example, by further incorporating red, green, and blue light from laser diodes as a combination of secondary wavelengths or light, a suitable a high quality white light can be generated at 7284 K with CRI as high as 85.1, suitable for indoor lighting applications.

Additional embodiments describe an active phosphor based on an on-chip tunable yellow-amber-red (peak wavelengths of 590 nm to 650 nm) nanowires-based LED grown on a transparent quartz substrate. The nanowires-based LED on quartz substrate emits at a center wavelength of 590 nm. By mixing light from the yellow-amber-red LED with a secondary red, green, and blue light from a laser diode source in transmission configuration (herein described as transmission mode), a high quality white light is produced having a CRI of 85.1. The active phosphor based on nanowires-based LED on quartz substrate enables the realization of high quality, extreme-tunable, durable, and compact white light source.

Prior light systems in U.S. Pat. Nos. 8,716,731 B2, and 8,647,531 B2 teach mixing of different compounds to produce a phosphor element emitting at different color which is limited because the color cannot, be tuned on-chip. US Patent Application Publication No. US2009/0153582 A1 teaches the use of a combination of ultraviolet light laser sources with the corresponding phosphor elements, in which the spectral characteristics of the phosphor elements cannot be actively tuned, thus lacking in the simplicity (single laser and single LED), facile tunability and durability that embodiments of the present disclosure provide. U.S. Pat. No. 8,629,425 B2 teaches a method of monolithic integration of two color LEDs, which is limited due to lack of independent tuning of the reported two color or wavelength components monolithically integrated in a device, each embedded in the form of quantum dots, resulting in the undesirable reabsorption of the blue light produced.

In comparison, an embodiment of the present disclosure teaches independent control of first and second wavelengths with the first wavelength resulting from III-Nitride nanowires epitaxially grown on low cost quartz substrate while exhibiting single crystalline quality and thus better control over the light emission line shape and CCT/CRI.

Prior nanowire based active phosphor systems were limited due to the requirement of reflective-geometry color mixing on opaque substrate, such as disclosed in U.S. patent application, Ser. No. 62/375,748. To address this problem, an embodiment of the present disclosure teaches a transmission mode active phosphor using a transparent substrate to enable a more flexible and direct approach in designing white light sources. Transparent quartz substrates also have the added advantage of scalability and direct integration with existing consumer devices compared to conventional substrates currently used for light emitter fabrication.

The present disclosure presents a CCT-tunable white light generation system comprising a laser diode or a combination of laser diodes in conjunction with a broadly tunable III-Nitride nanowires-based LED element grown on transparent or semi-transparent substrate. The wide wavelengths of the nanowires-based LED is broadly tunable and may cover the ultraviolet regime, the visible regime, or the infrared regime. The second or a combination of secondary light source(s) may include one or several laser diodes with narrow linewidth. The transparent substrate may include, but is not limited to, glass, quartz, fused silica, and sapphire.

Application of quality white light generated by devices and methods of the present disclosure include indoor lighting, automotive lighting, back lighting units, outdoor lighting, and monolithic-integrated multicolor laser-nanowires LED chip for example.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which:

FIGS. 4A-B illustrate CRI and the extreme wide tunability of CCT as functions of current injection of LED and blue laser diode.

FIG. 5 Illustrates the LED as the first tunable broadband wavelength under direct current injection illuminated by a second wavelength from a blue laser diode from the backside.

DETAILED DESCRIPTION

A III-Nitride nanowires based device has reduced defect density, improved light-extraction with a larger surface to volume ratio, and increased internal quantum efficiency due to a reduced lattice-strain, thus considerably mitigating efficiency droop.

In one example, a III-Nitride nanowires on quartz sample was grown using a Veeco GEN 930 plasma-assisted molecular beam epitaxy (PA-MBE) system. Organic contaminants were removed from 500 μm thick, 2 inch diameter commercial quartz substrate using acetone and IPA. After cleaning, ~200 nm Ti was sputtered on the backside to enhance the substrate's heat absorption and uniformity. Functioning as a semi-transparent conducting layer, 20 nm of Ti was deposited on the wafer's front side using an e-beam evaporator. The sample was then transferred to a MBE growth chamber where the temperature was increased to a growth temperature. Temperature was calibrated with a pyrometer. Before Ga deposition, the sample was positioned facing a nitrogen plasma source for 10 minutes at elevated temperature to partially convert the Ti metal layer into TiN. Silicon doped GaN NW was first nucleated at a lower temperature of 640° C. followed by growth at a higher temperature of 740° C. for crystal quality improvement. Nitrogen (N2) flow was maintained at 1 standard cubic centimeter per minute (sccm) with RF plasma power source set to 350 W throughout the growth. An active region consisted of 5 pairs of GaN quantum barrier and InGaN quantum disks. The NW structure was capped with an Mg-doped p-GaN top as a p-contact layer.

Additional details of nanowires-based LED fabrication are disclosed in U.S. patent application, Ser. No. 62/375,748, entitled "Ultrabroad Linewidth Orange-Emitting Nanowires LED for High CRI Laser-Based White Lighting and Gigahertz Communications," the disclosure of which is incorporated by reference herein in its entirety.

Figure 1:
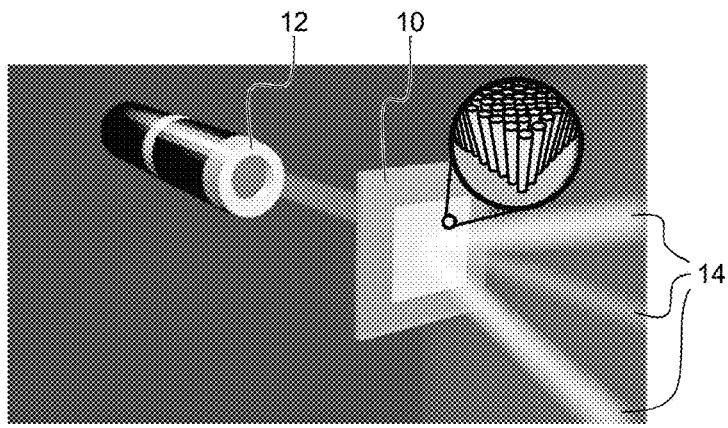
FIG. 1 illustrates a conceptual rendering of color mixing of first wavelength from the nanowires-based LED epitaxially grown on a transparent substrate and a second wavelength of the transmitted laser light, thus resulting in white light.

FIG. 1 illustrates a conceptual drawing of transmission mode color mixing using a transparent yellow-amber-red nanowires-based LED 10 as a broad tunable active phosphor and a blue light laser diode as a narrow linewidth light source 12 to produce white light 14. Owing to the transparency of the LED 10 substrate, it is possible to position the laser light source 12 directly behind the LED 10 to provide an additional degree of freedom in device and system design. In other examples of the present disclosure, the transparent substrate may include glass, quartz, fused silica, and sapphire.

Figure 2:
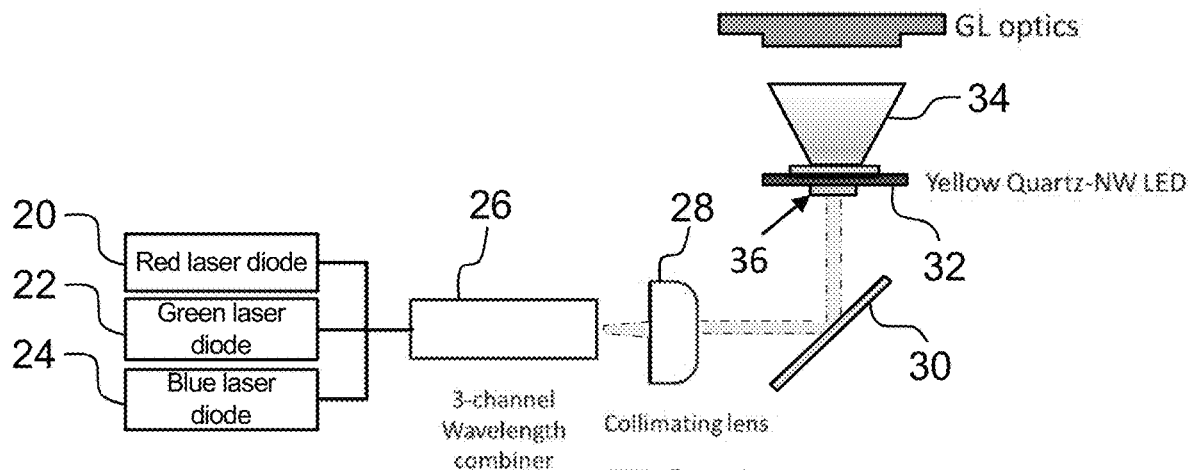
FIG. 2 illustrates a conceptual color mixing scheme for white light generation in accordance with one or more embodiment of the present invention.

FIG. 2 illustrates a color mixing system for white light generation. Red light is generated by red laser diode source 20, green light is generated by green light source 22, and blue light is generated by blue light source 24. Light sources 20, 22, 24 can be laser diode sources. A wavelength combiner 26 combines the RGB light from sources 20, 22, 24. In one example, a Thorlabs 3-channel wavelength combiner was utilized. The resulting RGB beam is collimated using a collimating lens 28 and reflected with a 45 degree mirror 30 toward the back side of yellow-amber-red nanowires-based LED on quartz 32. Diffuser 36 diffuses the collimated laser beam to allow mixing of white light. The RGB beam is mixed with light from the active phosphor from yellow-amber-red nanowires-based LED on quartz 32 to generate a high quality white light 34.

In one example, the III-Nitride nanowires-based LEDs on quartz with mesa dimension of 500×500 μm$^2$ were fabricated using standard microfabrication technique. All electrical measurements were done at room temperature. A color mixing experiment utilized a III-Nitride nanowires-based LED on quartz as a current-dependent broad wavelength source, thus constituting an active phosphor element, and red-green-blue (RGB) laser diodes as a combination of secondary wavelengths with narrow linewidth. The beams from the RGB laser diodes were first combined together using a Thorlabs 3-channel wavelength combiner, and then collimated using a collimating lens. The collimated beam was then reflected using a 45° mirror onto the backside of the III-Nitride nanowires-based LED on quartz, and passed through the LED's top side. The detector was positioned above the III-Nitride nanowires-based LED on quartz to collect the wavelength of resulting mixed color light. CIE and CCT were then calculated using GL optics software based on CIE 1931 standard.

Figure 3A:
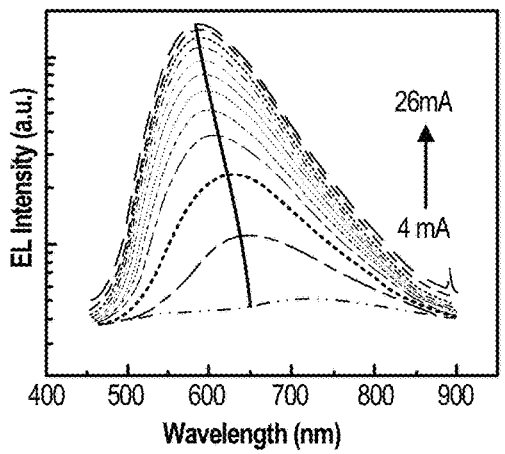
FIGS. 3A-B illustrate spectral characteristics (electroluminescence, EL, intensity; full-width at half-maximum, FWHM; peak wavelength) as a function of LED current injection.
Figure 3B:
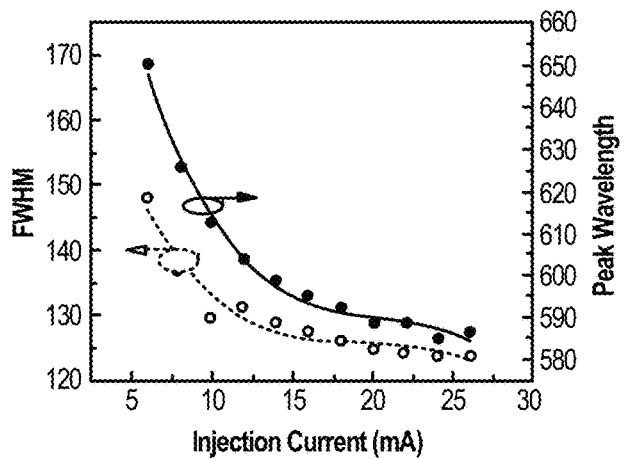

FIGS. 3A-B illustrate the broad tunability of spectral characteristics including electroluminescence (EL intensity), full-width at half-maximum (FWHM), and peak wavelength as a function of LED current injection for an embodiment of the present disclosure. The wavelength coverage spans from 450 nm (blue) to 900 nm (near infrared). In FIG. 3A, LED current injection ranges from 4 mA to 26 mA. In FIG. 3B, LED current injection ranges from approximately 5 mA to 26 mA.

FIGS. 4A-B illustrate the broad tunability of white light produced by mixing a narrow blue laser diode light with the active phosphor from a III-Nitride nanowires-based LED on quartz. As shown, the LED current injection (FIG. 4A) and the laser diode current injection (FIG. 4B) were varied to change correlated color temperature (CCT) and color rendering index (CRI). The CCT and CRI were directly measured using a GL Spectis 5.0 Touch spectrometer measurement system.

In another experimental setup, as shown in FIG. 5, a yellow-amber-red III-Nitride based LED on quartz under direct current injection was illuminated by a blue laser beam from the underside. The LED was placed on top of a transparent glass slide. The current injection for the LED was supplied by a Keithley 2400 source meter. A Thorlabs LP-450 SF15 laser diode was used as the laser beam source.

Figure 6:
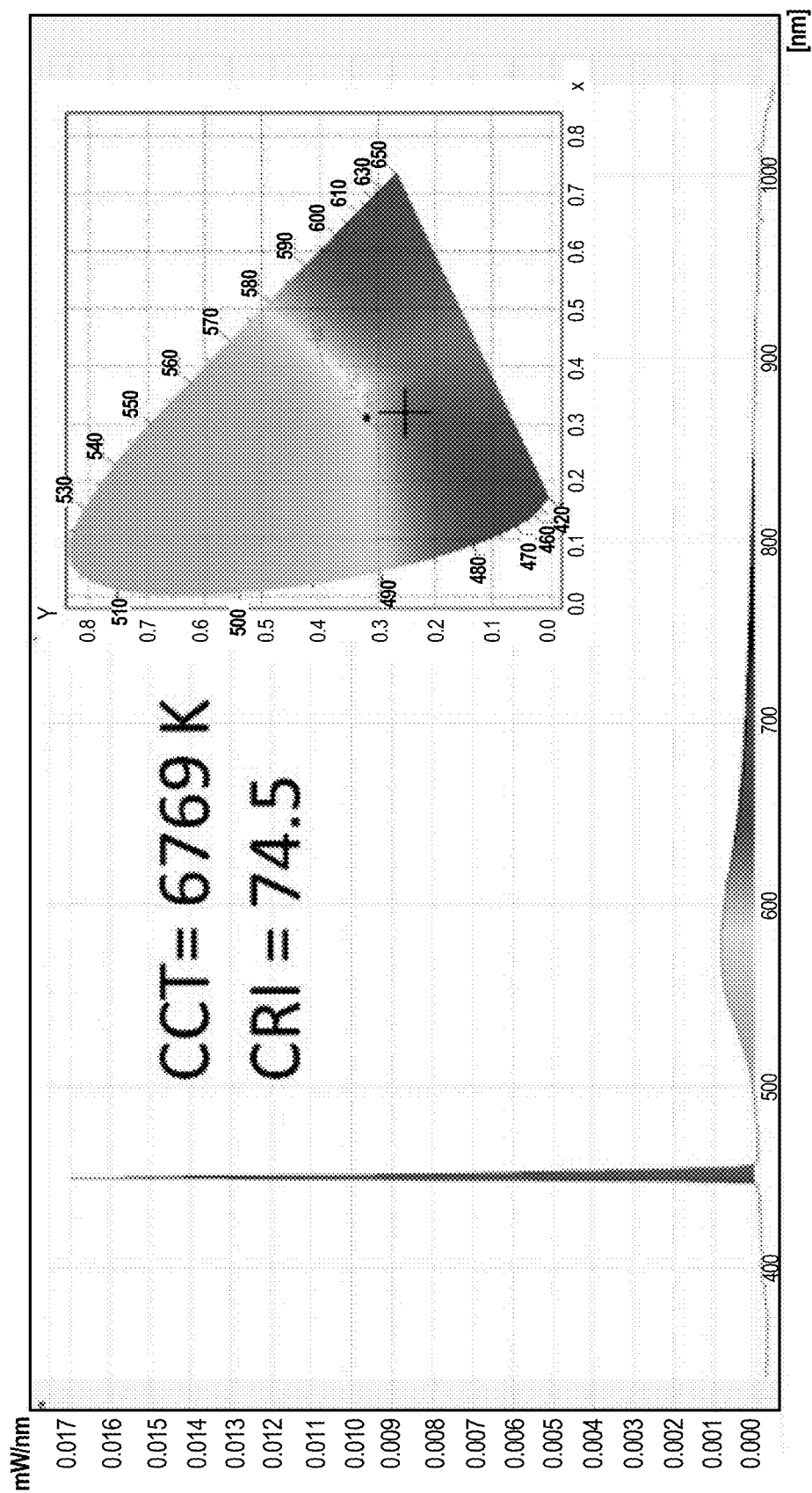
FIG. 6 is an illustration of color spectrum and CIE 1931 color space diagram for mixing of a first broadband wavelength (yellow-amber-red) and second narrow wavelength (blue).
Figure 7:
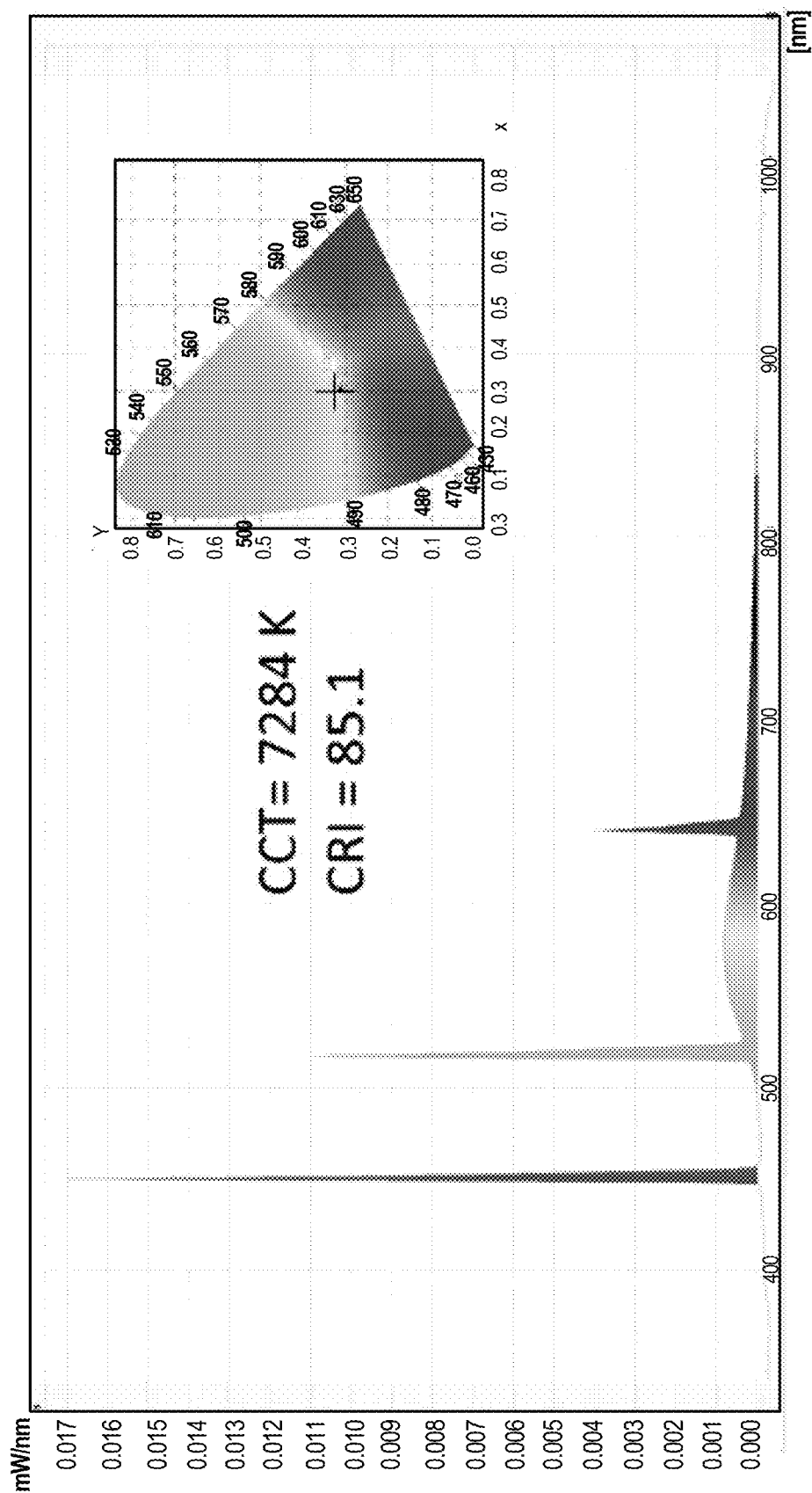
FIG. 7 is an illustration of color spectrum and CIE 1931 color space diagram for mixing of a first broadband wavelength (yellow-amber-red) and secondary narrow wavelengths (red, green, and blue).

White light obtained after mixing broadband yellow-amber-red light and diffused blue laser light was evaluated according to the CIE 1931 standard. FIG. 6 illustrates the white light spectra along with a CIE 1931 color space diagram (inset). A CCT of 6769 K and CRI of 74.5 were observed. CRI provides a quantitative measure of the degree of a light source revealing the color of an object under consideration, when compared to a Planckian light source having the same Kelvin temperature. In comparison, FIG. 7 illustrates the white light spectra and color space diagram for a RGB light source mixed with yellow light, where a CCT of 7284 K and CRI of 85.1 were observed.

The foregoing description of various preferred embodiments of the disclosure have been presented for purposes of illustration and description. It is not intended to be exhaustive or to limit the disclosure to the precise embodiments, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto. Various examples have been described. These and other examples are within the scope of the following claims.

Other embodiments of the present disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of this disclosure. It should be understood that various features and aspects of the disclosed embodiments can be combined with or substituted for one another in order to form various embodiments. Thus, it is intended that the scope of at least some of the present disclosure should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A white light generator, comprising: an active element including a nanowires-based light emitting device (LED) emitting light with wavelengths in a yellow-amber-red wavelength range, with nanowires of said active element being formed on at least one side of a transparent substrate; and an external light source emitting light at a second wavelength outside of said yellow-amber-red wavelength range toward a second side of the transparent substrate opposite the one side, with said light source being positioned away from the transparent substrate, and with light from the active element combining with light from the external light source that passed through the transparent substrate to generate a white light being emitting away from the one side of the transparent substrate.

2. The white light generator of claim 1, wherein the active element is an active phosphor element emitting light which is tunable through current injection.

3. The white light generator of claim 1, wherein the nanowires of the active phosphor element are epitaxially grown on one side of the transparent substrate.

4. The white light generator of claim 2, wherein said light is tunable from 590 nm to 650 nm by adjusting current injection while maintaining the external light source above 120 nm.

5. The white light generator of claim 1, wherein the external light source emitting light at the second wavelength is a narrow linewidth laser.

6. The white light generator of claim 2, wherein on-chip tuning of the active phosphor element by current injection enables tunability of correlated color temperature (CCT) values resulting from variability in light intensity, peak wavelength, and spectral coverage.

7. The white light generator of claim 1, wherein a combination of fixing the broadband light wavelength and tuning the second wavelength external light source enables wide CCT-tunability of generated white light.

8. The white light generator of claim 1, wherein the external light source emits at wavelengths of red, at approximately 642 nm, green, at approximately 520 nm, and blue, at approximately 450 nm.

9. The white light generator of claim 5, wherein CCT values range from 5000 K to greater than 8000 K and color rendering index (CRI) is above 65 by adjusting current injected into the nanowires-based LED and fixing the second wavelength to approximately 450 nm.

10. The white light generator of claim 6, wherein CCT values range from 3000 K to 7000 K and color rendering index is above 55 by adjusting current injected into the external light source and fixing current injected into the nanowires-based LED.

11. The white light generator of claim 1, wherein the substrate includes electrical contacts for current injection while maintaining transmission of the second wavelength.

12. The white light generator of claim 1, wherein the white light generator is housed within a lighting enclosure or vehicle light system.

13. A white light generation system comprising:
a transparent substrate having a first surface and a second surface;
a plurality of nanowires-based LEDs formed on a first surface of the transparent substrate and emitting light away from the first surface; and at least one external light source positioned away from the transparent substrate and with light from said at least one external light being directed toward the second surface and passing through the transparent substrate and exiting the first surface and then combining with light from the plurality of nanowires-based LEDs to produce a white light being emitted in a direction away from the first surface.

14. The white light generator of claim 13, wherein the light from the plurality of nanowires-based LEDs is tunable through current injection.

15. The white light generator of claim 13, wherein the at least one external light source is a laser.

16. The white light generator of claim 13, wherein CCT values range from 3000 K to 7000 K and color rendering index is above 55 by adjusting current injected into the at least one external light source and fixing current injected into the plurality of nanowires-based LEDs.

17. A method of white light generation comprising:
emitting light from a plurality of nanowires-based light emitting devices (LEDs) formed on a first side of a transparent substrate;
directing light emitted from a secondary light source toward a second side of the transparent substrate opposite the first side, with at least some light from the secondary light source passing through the transparent substrate; and
mixing light from the secondary light source that entered the transparent substrate at the second side and then passed through the transparent substrate with light from the plurality of nanowires-based LEDs to produce a white light combination being emitted in a direction away from the first surface.

18. The method of claim 17, wherein said directing light includes directing light through a collimating lens prior to said light entering the second side of the transparent substrate.

19. The method of claim 17, wherein said directing light includes reflecting light with a mirror positioned between the transparent substrate and the secondary light source.

20. The method of claim 17 further comprising,
tuning white light characteristics by adjusting light emitted by the plurality of nanowires-based LEDs or secondary light source or both via current injection.

* * * * *